United States Patent [19]
Collins et al.

[11] Patent Number: 5,874,361
[45] Date of Patent: Feb. 23, 1999

[54] METHOD OF PROCESSING A WAFER WITHIN A REACTION CHAMBER

[75] Inventors: Kenneth S. Collins, San Jose; Douglas Buchberger, Tracy, both of Calif.

[73] Assignee: Applied Materials, Inc., Santa Clara, Calif.

[21] Appl. No.: 736,456

[22] Filed: Oct. 24, 1996

Related U.S. Application Data

[62] Division of Ser. No. 475,368, Jun. 7, 1995, and a continuation of Ser. No. 452,351, May 26, 1995, Pat. No. 5,583,737, which is a division of Ser. No. 137,279, Oct. 14, 1993, which is a continuation-in-part of Ser. No. 984,797, Dec. 2, 1992, Pat. No. 5,350,479.

[51] Int. Cl.$^6$ ................................................. H04L 21/00
[52] U.S. Cl. ................................. 438/716; 216/67; 216/68
[58] Field of Search ........................... 156/643.1, 625.1, 156/345; 216/63, 67, 68; 118/723 R, 723 I, 723 IR; 204/192.1; 438/711, 716

[56] References Cited

U.S. PATENT DOCUMENTS

| | | |
|---|---|---|
| 4,667,110 | 5/1987 | Kariya .................................. 250/492.2 |
| 5,117,121 | 5/1992 | Watanabe et al. ...................... 307/103 |
| 5,221,450 | 6/1993 | Hattori et al. ..................... 204/192.32 |
| 5,350,479 | 9/1994 | Collins .................................... 156/345 |
| 5,459,632 | 10/1995 | Birang et al. ............................ 361/234 |
| 5,583,737 | 12/1996 | Collins et al. .......................... 361/234 |
| 5,707,692 | 1/1998 | Suzuki ................................... 427/562 |

FOREIGN PATENT DOCUMENTS 64-18236  1/1989  Japan .

*Primary Examiner*—R. Bruce Breneman
*Assistant Examiner*—Luz Alejandro
*Attorney, Agent, or Firm*—Thomason & Moser

[57] ABSTRACT

A method of dechucking a workpiece from an electrostatic chuck. The method adaptively produces a dechucking voltage for canceling any unpredictable residual electrostatic fields between a workpiece and the electrostatic chuck. The method contains the steps of (a) applying a lifting force to the workpiece; (b) altering the chucking voltage; (c) measuring the lifting force; (d) comparing the measured lifting force to a threshold level; and, depending on the result of the comparison, either (e) maintaining the chucking voltage at its present level for a predefined period of time and physically dechucking the workpiece or (f) repeating steps (b), (c), (d) and (e).

5 Claims, 6 Drawing Sheets

METHOD OF PROCESSING A WAFER WITHIN A REACTION CHAMBER

CROSS REFERENCE TO RELATED APPLICATIONS

This application is a divisional of patent application Ser. No. 08/475,368, filed on Jun. 7, 1995 and is a continuation application of patent application Ser. No. 08/452,351 filed May 26, 1995, now U.S. Pat. No. 5,583,737, which is a division of patent application Ser. No. 137,279, filed Oct. 14, 1993, which is a continuation-in-part of patent application Ser. No. 984,797, filed Dec. 2, 1992, now U.S. Pat. No. 5,350,479.

BACKGROUND OF THE INVENTION

1. Field of the Invention

The invention relates generally to electrostatic chucks for holding a workpiece and, more specifically, to a method for releasing a workpiece (such as a semiconductor wafer) from an electrostatic chuck.

2. Description of the Background Art

Electrostatic chucks are used for holding a workpiece in various applications ranging from holding a sheet of paper in a computer graphics plotter to holding a semiconductor wafer within a semiconductor wafer process chamber. Although electrostatic chucks vary in design, they all are based on the principal of applying a voltage to one or more electrodes in the chuck so as to induce opposite polarity charges in the workpiece and electrodes, respectively. The electrostatic attractive force between the opposite charges presses the workpiece against the chuck, thereby retaining the workpiece.

In semiconductor wafer processing equipment, electrostatic chucks are used for clamping wafers to a support pedestal during processing. The support pedestal may form both an electrode and a heat sink as used in etching or chemical vapor deposition (CVD) applications. More specifically, the electrostatic chuck has a layer of dielectric material covering a conductive pedestal base. In a "unipolar" electrostatic chuck, voltage is applied to the conductive pedestal base relative to some internal chamber ground reference. Electrostatic force is established between the wafer being clamped and the electrostatic chuck. When the voltage is applied, the wafer is referred back to the same ground reference as the voltage source. Alternatively, the plasma can reference the wafer back to ground, although some voltage drop occurs across plasma sheaths that form at both the wafer being clamped and the reference electrode.

To cool the wafer during processing, an inert gas such as helium is pumped between the wafer and chuck surface so as to act as a thermal transfer medium to the water-cooled chuck. With helium pressure applied at the wafer-to-chuck interface, a relatively high electric field magnitude is required to generate the necessary electrostatic force required to clamp the wafer. For example, an electrostatic chuck using an alumina dielectric (a dielectric constant of approximately 10) that is operated at a heat transfer gas pressure in the range of 15 to 30 torr requires an electric field magnitude in the range of $0.5 \times 10^5$ to $1 \times 10^5$ V/cm. The electric field in a vacuum gap between the wafer and the chuck is higher by the ratio of the dielectric constants of the dielectric material and vacuum. In this example, the ratio is approximately 10 to 1; thus, the electric field in a vacuum gap can be ten times greater than the electric field at the surface of the wafer. Specifically, the resultant electric field can reach $1 \times 10^6$ to $5 \times 10^6$ V/cm in the vacuum gap.

Such high electric field magnitudes can cause charging of the dielectric material that may inhibit dechucking of the wafer after processing. In an ideal dielectric, i.e., bound charges only, the high electric field can cause charging of the surface between the wafer and the chuck. The mechanism causing this charging is field emission charging that is made possible by the high electric field reducing the potential barrier height, i.e., overcoming the work functions of the wafer and/or the chuck surface materials, allowing charges to tunnel from the wafer to the chuck surface or vice versa. The amount of charging caused by field emissions depends on the work functions of the surface materials concerned and the effective electric fields at the interface between the surfaces. The induced electric field resulting from field emission charging always opposes the applied electric field, reducing the net electric field and the resultant electrostatic force between the chuck and wafer. However, when the applied electric field is removed, i.e., the chuck voltage is set to 0 volts, a residual electrostatic force remains due to the presence of charge on the surface of the chuck and on the wafer backside surface as a result of the field emission charging. Consequently, dechucking of the wafer may be difficult because the residual electrostatic force must be overcome by a mechanical wafer lift mechanism to remove the wafer from the chuck.

The high electric field magnitude can cause other charging behavior that leads to additional dechucking difficulties. For example, if the chuck dielectric material is not an "ideal" dielectric, i.e., some unbound charge or "free charge" is present, then the free charge can drift through the dielectric material under the influence of the applied electric field. The free charges migrate toward the interface between the chuck and the wafer, producing an increase in free charge density near the surface of the chuck. Depending on the contact resistance between the wafer backside and the chuck surface, the charge may not be able to cross the interface. The result is an accumulation of charge within the dielectric material close to the surface of the chuck dielectric. This charge migration phenomenon depends upon material, time, temperature and electric field magnitude. The result is an effective increase in the electrostatic force at the wafer-to-chuck interface over that of the ideal dielectric. Since both polarization charges and free charges contribute to the electrostatic force, the force increase occurs due to the effective reduction in the separation distance between charges on the wafer backside and charges in the dielectric. However, when the applied electric field is removed, i.e., the chuck voltage is set to 0 volts, a residual electrostatic force remains due to the presence of migrated charges within the chuck dielectric and on the wafer backside surface. As such, the residual electrostatic force increases the physical force necessary to dislodge the wafer from the chuck.

The above effects are two examples of charging phenomenon that occur during electrostatic chuck operation that can affect the ability to dechuck a wafer. In fact, both charging phenomenon can occur on a particular electrostatic chuck depending on the conditions under which the chuck is operated. However, field emission charging and charge migration charging produce competing effects, i.e., field emission charging produces an electric field opposing the direction of the applied field and charge migration charging produces an electric field directed in the same direction as the applied field. For example, a unipolar chuck comprised of a plasma sprayed ceramic such as $Al_2O_3/TiO_2$ dielectric operated in a high density plasma etch process at low temperatures (e.g., −10 degrees Celsius) has a dominant field emission charging phenomenon. Field emission charging reduces the electrostatic force during processing and leads to a residual electrostatic force after removing the applied electrostatic chuck voltage. If the wafer is somehow removed from the electrostatic chuck, and if another wafer is processed using the same chuck, an additional charging of the dielectric occurs. This cumulative charging effect continues until charge saturation occurs at some charge level that depends on the environmental conditions used during processing of the wafers.

Alternatively, if the same chuck is operated at a higher temperature (e.g., +30 degrees Celsius), under the same environmental conditions, then charge migration through the dielectric dominates the residual charging process. The high charge density at the wafer-to-chuck interface that results due to charge migration serves both to increase the applied electric field and to neutralize, to some degree, field emission charging at the chuck surface. The effective electric field and electrostatic force between the electrostatic chuck and the wafer is increased by the charge migration charging effect. However, once the applied chucking voltage is removed, a residual electrostatic force results which inhibits the dechucking of the wafer from the chuck. Because this charging depends on time, electric field strength and temperature, the residual effects are unpredictable. Additionally, the residual charge and force increases from wafer to wafer until some saturation condition is reached.

Consequently, there is a need for a dechucking method that is capable of dechucking a wafer from an electrostatic chuck under any environmental conditions and without damage to the hardware or the wafer being processed. Prior art techniques for dechucking the wafer include (1) setting the applied electrostatic chuck voltage to 0 and waiting some period of time for the wafer and electrostatic chuck to discharge; (2) setting the applied electrostatic chuck voltage to some other fixed voltage, waiting some period of time for the wafer chuck to discharge; (3) using either (1) or (2) followed by forcing the wafer off the electrostatic chuck by a mechanical means that overcomes the residual electrostatic forces; or (4) conductively connecting the wafer to ground by making ohmic contact between the wafer and ground. Methods (1), (2) and (3) suffer from unknown, and possibly very long, waiting periods. On the other hand, method (4) may not work on wafers with insulating backsides and may cause device damage to the wafers.

A significant shortcoming of the conventional approaches to removing the electric charge is that they fail to completely remove the charge such that some residual electrostatic force remains between the wafer and the chuck. This residual electrostatic force necessitates the use of a relatively large mechanical force to separate the wafer from the chuck. The force required for removal sometimes cracks or otherwise damages the wafer. Even when the wafer is not damaged, the difficulty of mechanically overcoming the residual electrostatic force sometimes causes the wafer to dislodge from the chuck unpredictably into a position from which it is difficult to retrieve using a conventional wafer transport robot.

Therefore, there is a need in the art for a method of dechucking a semiconductor wafer from an electrostatic chuck that minimizes the residual electrostatic force between the wafer and the chuck surface.

SUMMARY OF THE INVENTION

The disadvantages heretofore associated with the prior art are overcome by an inventive dechucking method for use with a conventional electrostatic chuck. The inventive method applies a relatively small mechanical force (dechucking force) to a workpiece (e.g., a semiconductor wafer) in a direction opposing the electrostatic force (chucking force) which clamps the wafer to the chuck surface. This dechucking force is applied either by a mechanical wafer lifting mechanism or by the pressure of the heat transfer gas applied to the backside of the wafer at the wafer-to-electrostatic chuck interface. Once the dechucking force is applied, the chucking voltage is swept from the initial clamping voltage through 0 volts towards some opposite polarity voltage. As this voltage is swept from one extreme to the other, the electrostatic force clamping the wafer is monitored by observing either the lifting force of the wafer lifting mechanism or the flow rate (or, alternatively, the pressure) of the gas applied to the wafer-to-electrostatic chuck interface. The lifting force applied while the chucking voltage is altered is monitored for a change. Depending upon the lifting force used, the force change is either a change in the heat transfer gas flow rate, heat transfer gas pressure or the lift pin force.

When one of these indicia of force traverses a threshold level, the method deems the residual electrostatic force to be sufficiently small, i.e., the electric field generated by the present level and polarity of chucking voltage substantially cancels the residual electrostatic force, to allow physical dechucking of the wafer without using an excessive lifting force. At a chucking voltage level and polarity where the mechanical force is deemed sufficiently small, i.e., when the residual electrostatic force is minimal, the chucking voltage (now a dechucking voltage) is held constant for a specified period of time and the wafer is then mechanically separated from the electrostatic chuck. Since the residual electrostatic force is of unknown magnitude due to the unpredictable nature of field emission and charge migration charging effect, the inventive method permits a minimal dechucking force to be adaptively determined that accommodates dechucking at any residual electrostatic force magnitude. At the point of minimal electrostatic force, the electric field generated by the applied dechucking voltage substantially cancels the electric field generated by the residual charges.

To further minimize the dechucking force, the residual charging is discharged by exposing, after each wafer is removed from the chuck, the electrostatic chuck surface to the plasma, i.e., the invention uses chuck post processing. As such, the residual charges do not accumulate upon the chuck surface from wafer-to-wafer.

In sum, although residual charging effects vary considerably depending on the wafer processing environment, the method of the present invention adaptively accommodates any wafer processing environment to generate an appropriate dechucking voltage that minimizes the dechucking force required to remove the wafer from the chuck. As such, wafer damage from dechucking is minimized and wafers can be quickly removed from the process chamber without waiting for discharge of the residual charge.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
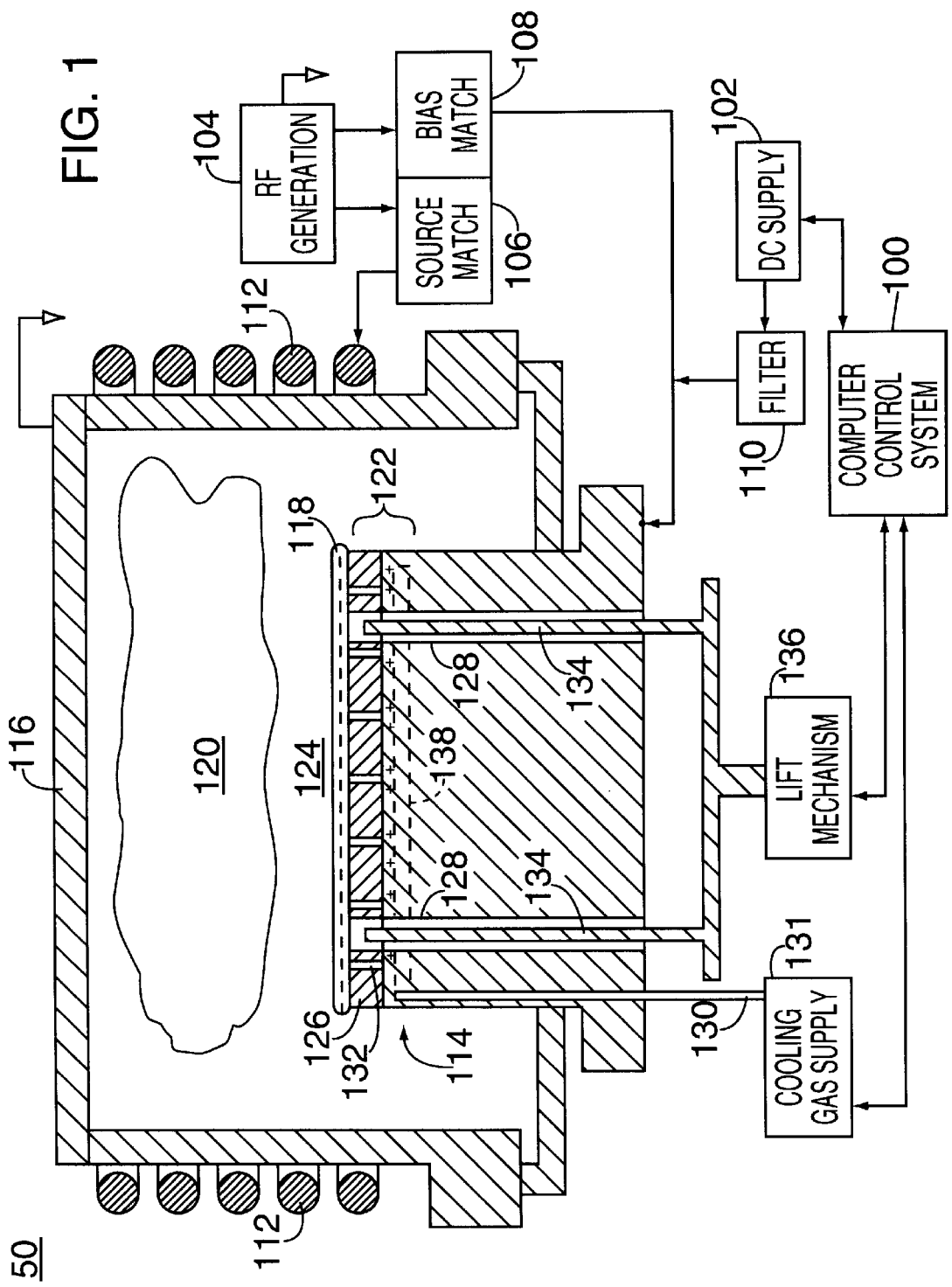
FIG. 1 is a sectional view, partially in schematic form, of a conventional semiconductor wafer fabrication process chamber which includes a conventional electrostatic chuck to which the invention can be applied.

FIG. 1 depicts a conventional electrostatic chuck adapted to support and electrostatically hold a workpiece to be processed, such as a semiconductor wafer, on a pedestal within a high density plasma reaction chamber. For a detailed understanding of the plasma reaction chamber and its operation in processing the wafer, the reader should refer to the drawings and the detailed description contained in patent application Ser. No. 07/941,507, filed Sep. 8, 1992, incorporated herein by reference into this patent application. That disclosure discloses a biased, high density plasma reaction chamber manufactured by Applied Materials, Inc. of Santa Clara, Calif. Additionally, a conventional electrostatic chuck that can be used with the present inventive method of dechucking is disclosed in U.S. Pat. No. 5,350,479 issued Sep. 27, 1994 to the assignee hereof, and its disclosure is incorporated herein by reference.

FIG. 1 depicts those electrical circuits as well as mechanical components of a conventional plasma reaction chamber that are necessary to understand the inventive method of dechucking a wafer. The electrical circuit includes a computer control system 100, a conventional DC voltage supply 102, and RF generator 104 and matching circuits 106 and 108. The DC voltage supply supplies the clamping voltage to the electrostatic chuck through a low-pass filter 110. The filter isolates the DC voltage source 102 from the RF generator 104. RF source power and RF bias power are each coupled from the conventional RF generator 104 producing one or more RF frequencies through matching networks 106 and 108 with the source power being coupled to an inductive antenna 112, and the bias power being coupled to the pedestal 114. A ground reference for both the RF bias power and DC voltage is a grounded top counter electrode 116. The DC voltage source 102 supplies positive 1,000 volts for developing an electric field that electrostatically retains a wafer 118 upon the pedestal 114. When it is desired to release (or "dechuck") the wafer, the DC voltage source is controlled by the computer control system 100 executing the method of the present invention described below.

The plasma reaction chamber 50 employs inductively coupled RF power to generate and maintain a high density, low energy plasma 120. RF bias power is capacitively coupled to the plasma via the wafer 114 and electrostatic chuck 122, with the grounded counter-electrode 116 located in the plasma source region providing a return path for bias current. With the configuration shown in FIG. 1, plasma density is controlled by the RF source power, and ion energy is independently controlled by the RF bias power. The result is a uniform high density, low electron temperature plasma 120 at the wafer 118 with ion energy controllable from about 15 eV to several hundred ev. This configuration allows for etching of the wafer with minimum charge up degradation and minimum energetic particle damage.

While the above-described plasma reaction chamber provides a high oxide etch rate, it does impose some severe hardware requirements, particularly on the electrostatic chuck 122. In particular, RF bias power must be uniformly coupled to the wafer and to the plasma. With a high density, low electron temperature plasma, the cathode sheath 124 is very thin, usually less than one millimeter, and the impedance per unit area of the cathode sheath is primarily resistive and quite low. For wafers of typical resistivity, unless RF bias is very uniformly coupled to the wafer, ion/electron current and ion energy will not be uniform. In addition to the problem of uniform electrical coupling, substantially uniform thermal coupling of the wafer to the cooled electrostatic chuck is required. The heat load imposed on the wafer is very large. For example, at a typical RF source power of 2,800 watts and RF bias power or 1400 watts, approximately 2 kW of heat must be removed continuously from the wafer.

To provide for such uniform coupling and thermal cooling, the pedestal 114 and the electrostatic chuck 122 comprises a one-piece aluminum block with direct liquid cooling. Such liquid cooling is provided by cooling water entering an inlet at an underside of the pedestal and traveling through cooling passages (not shown) to exit the pedestal through an outlet.

A smooth layer 126 of dielectric material is bounded to the smooth upper surface of the pedestal 114 for contacting an underside of the wafer. The layer 126 of dielectric material uniformly covers the entire upper surface of the pedestal 114 except over the four lift pinholes (two of which are shown at reference 128). Preferably, the pedestal is machined from an aluminum block which is finished to a smoothness and parallelism of less than 0.001 inches (25 microns) between the upper and lower faces, respectively. Holes are then bored in the pedestal as described below. The upper face of the pedestal is bead-blasted to improve adhesion, and then an approximately 0.020 inch (0.5 mm) thick ceramic dielectric layer of alumina or alumina/titania composite is then plasma-sprayed over the upper face of the pedestal. The sprayed layer is then ground to achieve a dielectric coating thickness of approximately 0.010 inches (250 microns) with the smoothness of 0.5 microns.

The dielectric layer in combination with the underlying aluminum block forms the electrostatic chuck 122.

A cooling gas, such as helium, is fed from supply 131 to the pedestal through a conduit 130 and distributed into each of seven axially-oriented gas conduits or cavities 138 within the pedestal. Each conduit is about 0.3 inches (7.5 mm) in diameter. One conduit is at the center axis of the pedestal, and the other six conduits are spaced evenly around and somewhat inward from the periphery of the pedestal. The conduits do not penetrate the dielectric layer. In fact, the conduits preferably do not quite extend all the way to the upper surface of the pedestal, but instead leave a thin layer of aluminum, preferably about 0.015 inches (380 microns) thick, above the upper end of each conduit. Each conduit may be formed by counter-boring a hole from the underside of the pedestal block.

The cooling gas is transported from each conduit or cavity to the surface of the dielectric layer via plurality of perforations 132, each perforation being at least an order of magnitude smaller in diameter than the conduits. Preferably, laser drilling is used to create perforations of about 0.006 to 0.008 inches (150–200 microns) in diameter through the dielectric layer and the thin layer of aluminum overlying each conduit. Several such perforations are formed above the upper end of each gas conduit or cavity. To distribute the cooling gas from the perforations over the upper face of the dielectric layer, a pattern of one or more gas distribution grooves is formed in the upper face. A single groove may intersect any number of these perforations, but each perforation communicates with at least one groove. The grooves should extend over most of the surface of the dielectric so that when a semiconductor wafer or other workpiece is placed on the electrostatic chuck, the cooling gas will flow up through the conduits, through the perforations, through the distribution grooves, and into the microscopic interstitial spaces between the underside of the substrate and the upper surface of the dielectric layer. A nominal gas flow rate (leakage rate) is achieved as a relatively small amount of heat transfer gas flows from beneath the wafer and into the chamber.

In the conventional operation of the process chamber, a robot arm (not shown) moves a wafer into the chamber through a slit valve. The robot places the wafer on the tips of the lift pins 134, which at this time are elevated by the pneumatic lift mechanism 136 so as to protrude 2 to 5 centimeters above the top of the electrostatic chuck 122. The pneumatic mechanism, under control of the computer control system 100, then lowers the lift pins 134 so that the wafer drops onto the surface of the chuck. The wafer's descent time typically is 1 to 3 seconds.

Once the lift pins have lowered the wafer onto the chuck, the plasma is initiated, i.e., the "strike" gas is supplied to the plasma chamber and the RF source power is applied to the antenna 112. Once the system strikes the plasma, the computer control system applies the DC chucking voltage to the chuck and applies the heat transfer gas to the wafer-to-chuck interface. The chucking voltage causes negative and positive charges to accumulate on the facing surfaces of the wafer and the chuck electrode, respectively. The amount of charge is proportional to the product of the voltage and the capacitance between the wafer and the chuck electrode.

After the wafer drops onto the upper dielectric of the chuck, the lift pins continue to descend into the pedestal. The opposite polarity charges on the wafer and chuck electrode produce an electrostatic attractive force which presses the wafer against the upper face of the chuck. The chucking voltage is set to a value high enough to produce an electrostatic force between the wafer and the chuck adequate to prevent the wafer movement during subsequent process steps within the process chamber. The wafer thus retained securely on the chuck is said to be chucked.

After the wafer is chucked, one or more semiconductor fabrication process steps are performed in the chamber, such as deposition or etching films on the wafer. For processes which employ plasma, the RF power supply selectively applies RF power to the antenna 112 and between the cathode pedestal and the grounded anode which generates a plasma 120 in the region above the wafer. The plasma provides an electrically conductive path between the wafer and ground. However, because the difference between the mobilities of electrons and positive ions, a DC voltage drop appears across the plasma so that the wafer is biased negative relative to ground. If the chucking voltage applied to the chuck electrode (the pedestal) by the DC voltage supply is positive, the total DC voltage between the wafer and the chuck electrode will be the sum of the wafer bias and the chucking voltage, thus the wafer bias increases the electrostatic force retaining the wafer.

After completion of the semiconductor fabrication process steps, the pneumatic lift mechanism raises the lift pins to raise the wafer above the chuck so that the wafer can be removed from the chamber via the robotics transport. Before the lift pins can raise the wafer, the wafer must be electrically dechucked, that is, the electrostatic force retaining the wafer on the chuck must be removed or canceled. Conventionally, the chucking voltage supply is turned off, and the chuck electrode and the wafer are both connected to ground so as to remove the respective charges which had accumulated on the chuck electrode and the wafer during the previous application of the chucking voltage to the chuck electrode. The wafer conventionally is grounded by leaving the RF power supply on at a reduced power level to maintain a plasma which provides an electrically-conductive path from the wafer to the grounded walls of the chamber. However, as discussed above, after a conventional dechucking method is used, a residual charge still remains on the wafer and chuck due to charge migration and/or field emission charging. As such, the prior art dechucking methods may require undue physical force to dislodge the wafer from the chuck.

Figure 2:
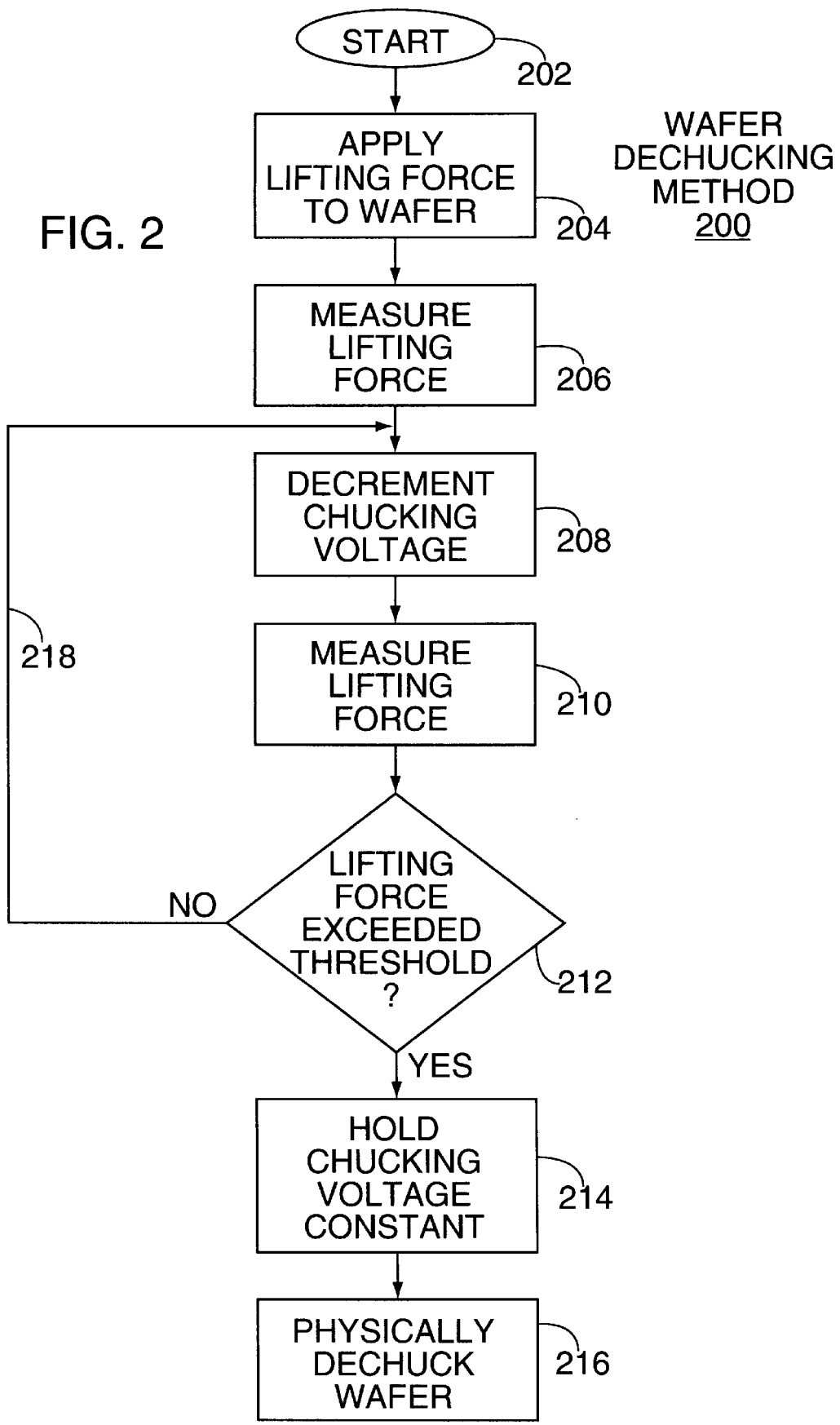
FIG. 2 is a flow chart of the method used to dechuck the wafer from the electrostatic chuck of FIG. 1.

The inventive method of dechucking the wafer from the electrostatic chuck is depicted as a flow chart in FIG. 2. This method is generally implemented as a software routine executed upon the computer control system. Dechucking method 200 starts at step 202 and continues with step 204. At step 204, a lifting force is applied to the wafer. This lifting force is relatively small in magnitude and does not dislodge the wafer from the surface of the electrostatic chuck, but rather is used as a measuring tool of the force required to remove the wafer from the chuck. At step 206, the method measures this lifting force. Typically, this is accomplished by using a force gauge attached to the lifting mechanism to determine the present lifting force applied by the four pins upon the underside of the wafer. Alternatively and preferably, the lifting force is applied by the pressure of the heat transfer gas and the force is monitored using a flow rate gauge (e.g., a gas flow monitor) within the gas supply. Alternatively, the pressure of the heat transfer gas could also be monitored (e.g., using a capacitive manometer) as an indicia of the lifting force being applied. Assuming a relatively low gas leakage rate through the wafer-to-chuck interface, the lifting force is directly proportional to the gas pressure in the conduit carrying the helium to the electrostatic chuck or inversely proportional to the gas flow rate. Thus, a change in either pressure or flow rate indicates a change in the residual electrostatic force clamping the wafer to the chuck. More specifically, with a constant gas pressure applied to the backside of the wafer, when the residual electrostatic force is reduced by the canceling effect of an applied chucking voltage, the wafer will lift slightly from the chuck surface causing a momentary increase in flow rate and a corresponding decrease in gas pressure. This phenomenon is known as a flow burp.

At step 208, the method decrements the chucking voltage by a pre-defined amount. The typical decrement amount is approximately 100 volts, beginning at a chucking voltage of approximately +1000 volts. At step 210, after a decrement in chucking voltage, the lifting force is again measured. At step 212, the measured lifting force is compared to a threshold level. If the lifting force has fallen below the threshold level, the method proceeds to step 214. If the lifting force has not fallen below the threshold level, the routine proceeds along path 218 and returns to step 208, wherein the chucking voltage is again decremented by the pre-established amount, e.g., 100 volts. Consequently, the dechucking method 200 includes the dechucking loop comprised of steps 208, 210, 212 and path 218, wherein the chucking voltage is repeatedly decremented by pre-established amounts until the measured lifting force, either indicated by the force gauge on the lifting pins or the pressure or flow rate of the heat transfer gas, traverses a pre-set threshold. Preferably, the threshold is a pre-defined flow rate and the method exits the dechucking loop when the measured flow rate exceeds the pre-defined threshold flow rate. The increased gas flow rate (flow burp) occurs when the applied voltage produces an electric field that substantially cancels the residual electrostatic field. Once canceled, the residual electrostatic force is virtually eliminated and the gas pressure slightly lifts the wafer from the chuck causing the flow burp.

When the query at step 212 is answered affirmatively, the method proceeds to step 214, where the present level of chucking voltage is held constant for a pre-defined period of time, generally being five seconds. After the pre-defined time has elapsed, the lift pins are used at step 216 to physically dechuck the wafer from the surface of the electrostatic chuck.

Since the dechucking force required to dislodge the wafer and the dechucking voltage required to cancel the residual electrostatic fields is unknown, the method of the present invention is adaptive such that the method determines a dechucking voltage that effectively cancels any of the residual electrostatic fields remaining within the chuck-to-wafer interface. As such, the inventive method can be used to dechuck workpieces in real time without any pre-setup or pre-established measuring having to be accomplished. The efficacy of the inventive method is demonstrated through experimental results that have been achieved using the method. FIGS. 3, 4, 5 and 6 depict experimental results using the inventive method in a variety of environments within a reaction chamber. In each of these experiments, the chucking voltage was reduced in increments of 100 volts from an initial chucking voltage of +1,000 volts. A heat transfer gas pressure of 15 torr during he chucking and processing of the wafer was used. To dechuck he wafer, typically, the heat transfer gas pressure is reduced from approximately 15 torr to approximately 3 to 5 torr. At this lower pressure, when the optimal dechucking voltage is attained, the wafer will not leap from the chuck. For these particular experiments, the mechanism for applying a lift force was the heat transfer gas pressure (e.g., helium pressure), and the threshold for determining a minimum dechucking voltage was to determine a flow rate increase in the helium of 3 SCCM. This increase in flow rate is known as a flow burp that indicates a reduced electrostatic force retaining the wafer to the chuck.

Figure 3:
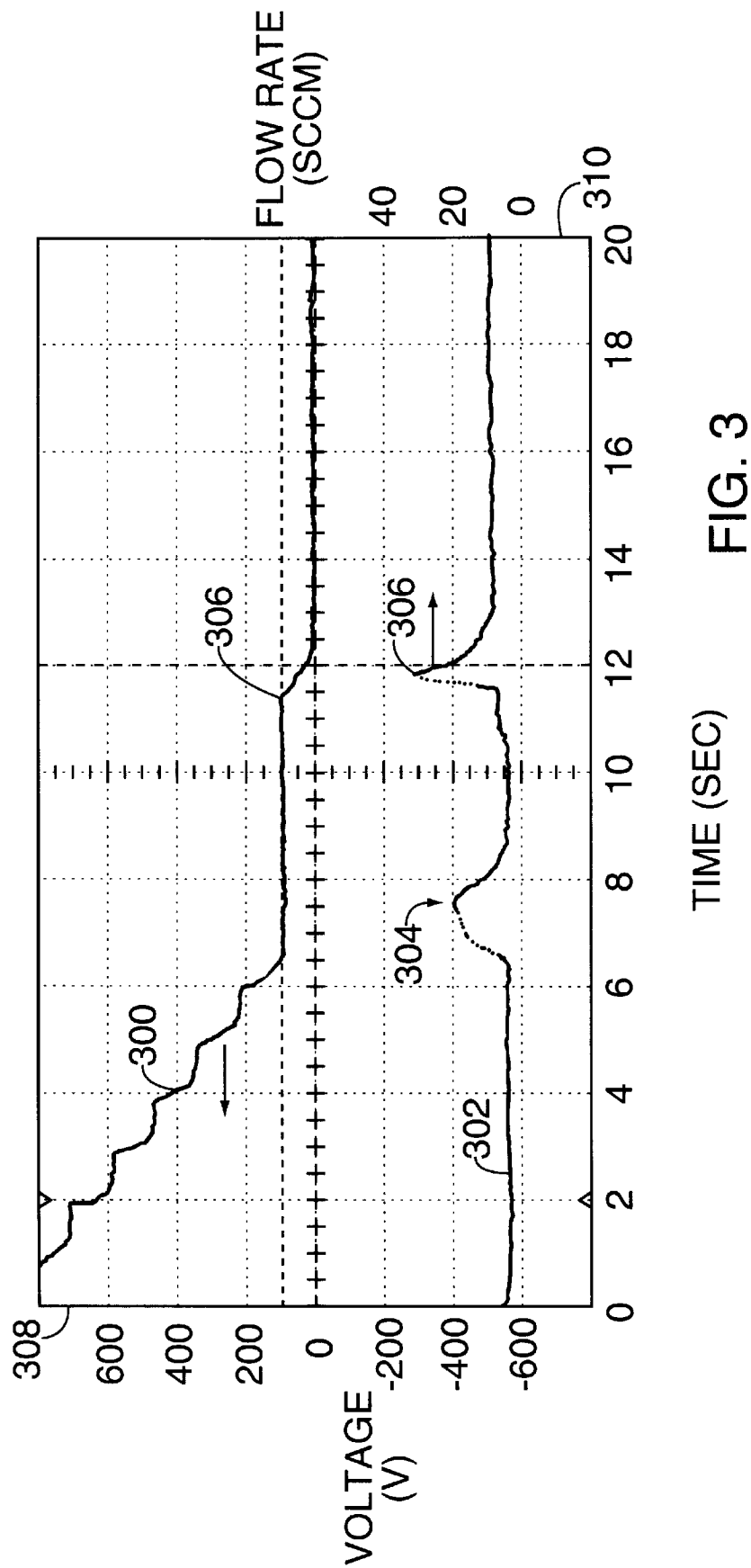
FIG. 3 is a graph of dechucking voltage and helium flow rate vs. time for a chuck operating at −10 degrees Celsius and using chuck post processing.

In FIG. 3, the surface of the electrostatic chuck is initially exposed to the plasma to discharge any residual charge that remains on the electrostatic chuck surface from the previously-processed wafer. This is known as chuck post processing. The chuck temperature for this example is –10 degrees Celsius. Within such an environment, the dielectric of the electrostatic chuck operates as a substantially ideal dielectric. As such, field emission charging is the dominant cause of residual electrostatic forces between the wafer and the electrostatic chuck surface. From a chucking voltage of +1,000 volts (left-hand scale 308), the chucking voltage 300 is decremented in 100-volt steps, as shown in FIG. 3, until a change in flow rate 302 (right-hand scale 310) (flow burp 304) is detected. At that point, the chucking voltage is held constant for a period of approximately 6 seconds, and then the wafer is physically dechucked (at 306) by moving the lift pins to engage the wafer and lift the wafer from the chuck. The voltage level at which the flow burp occurs in this chamber environment is +100 volts.

Figure 4:
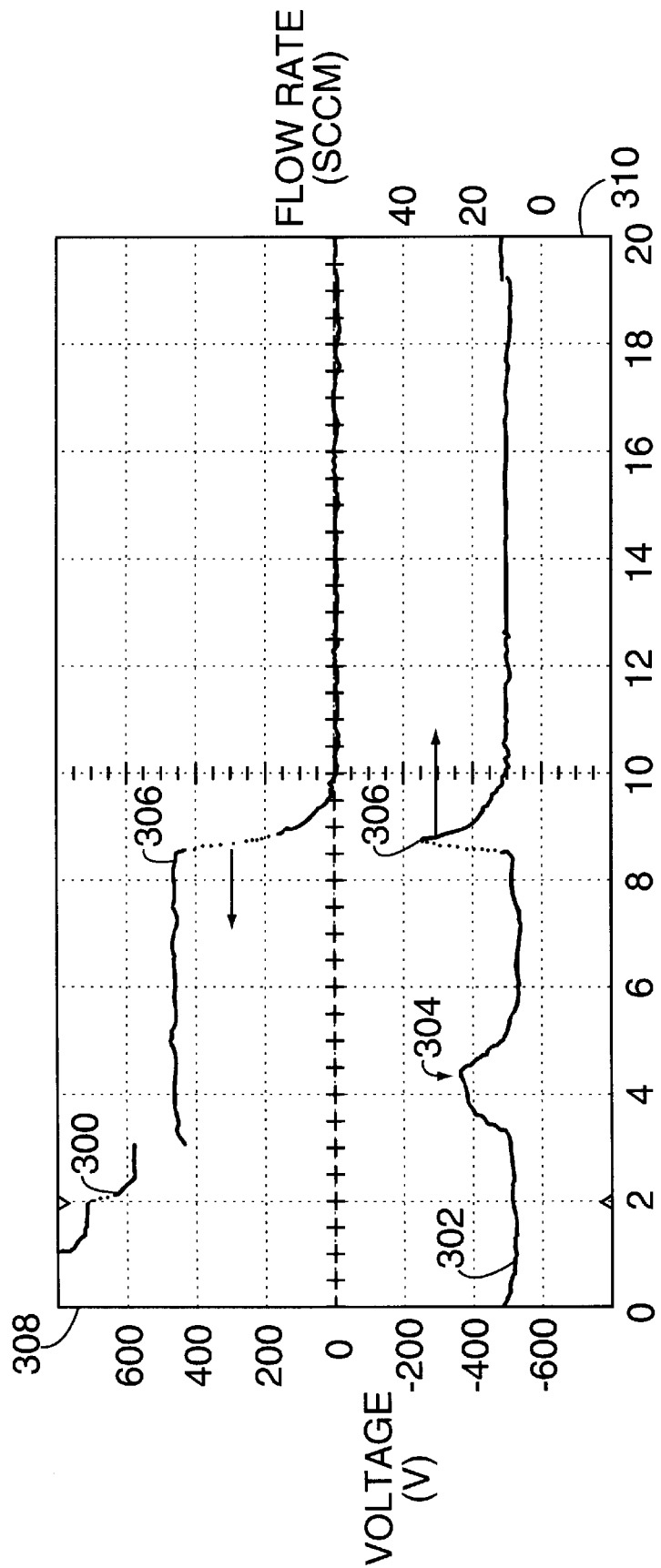
FIG. 4 is a graph of dechucking voltage and helium flow rate vs. time for a chuck operating at −10 degrees Celsius and without using chuck post processing.

FIG. 4 shows experimental results achieved while the wafer and electrostatic chuck operating under the same environmental conditions, i.e. –10 degrees Celsius chuck temperature.

However, in this experiment there was no electrostatic chuck post processing. Again, the chucking voltage is decremented in 100 volt increments, and in this experiment, the helium flow burp occurs 304 at a dechucking voltage of +468 volts. Without post-processing, the field emission charging that had occurred with the previously-processed wafer causes a decreased electrostatic attraction between the present wafer and the electrostatic chuck surface. Thus, a higher dechucking voltage is necessary to cancel the electric field generated by the accumulated residual charges.

Figure 5:
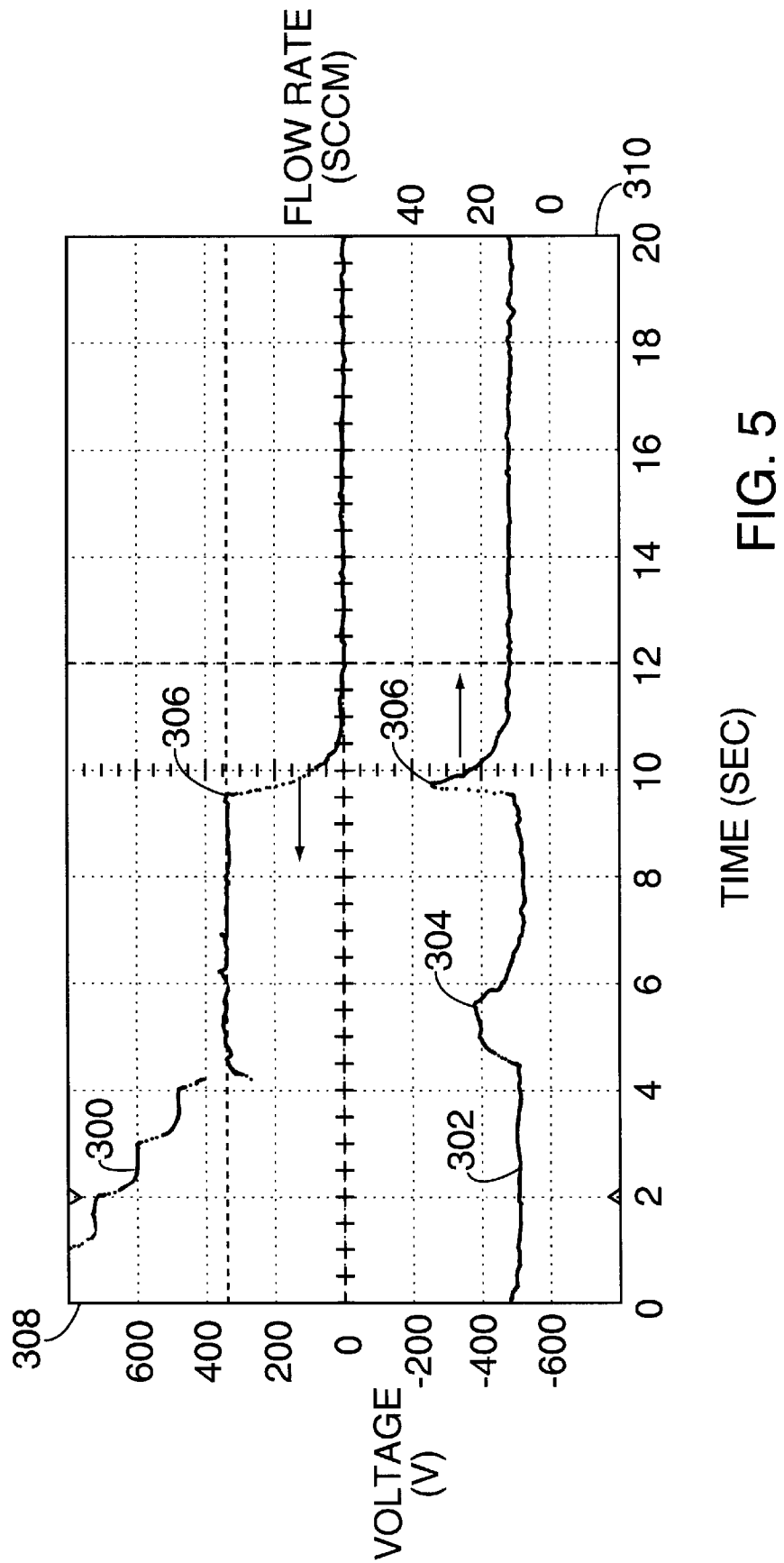
FIG. 5 is a graph of dechucking voltage and helium flow rate vs. time for a chuck operating at +10 degrees Celsius and without using chuck post processing.

FIG. 5 shows experimental results when there is no chuck post-processing and using a slightly increased chuck temperature of +10 degrees Celsius. For this experiment, the helium flow burp 304 occurs at +330 volts. In such a case, field emission charging remains the dominant charging effect. However, at this higher chuck temperature, the charge migration charging does have some effect upon the residual electrostatic force (reduces the force) that remains between the workpiece and the electrostatic chuck surface. As such, a lesser, but still positive, dechucking voltage is necessary than shown in FIG. 4.

Figure 6:
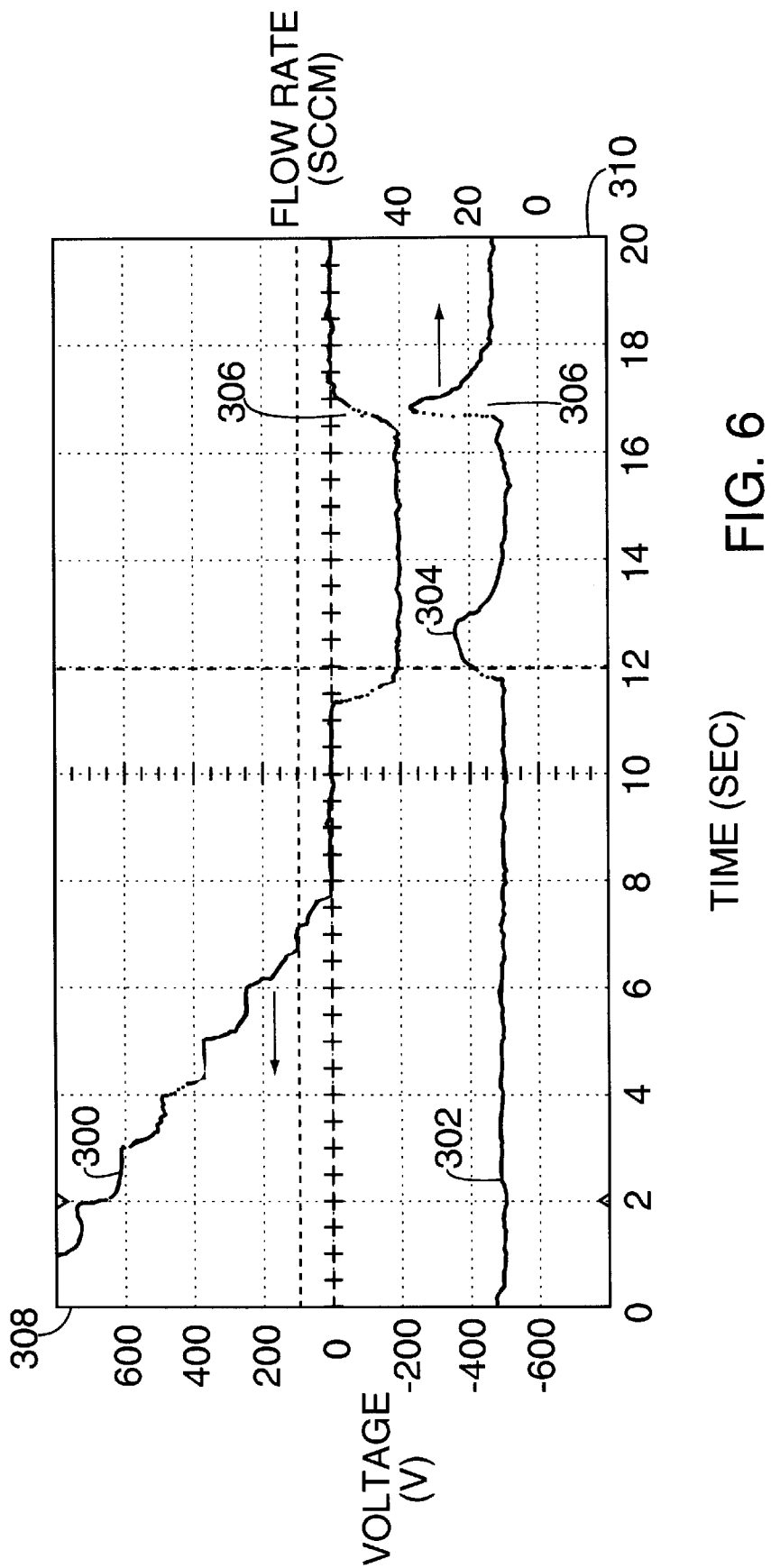
FIG. 6 is a graph of dechucking voltage and helium flow rate vs. time for a chuck operating at +30 degrees Celsius and using chuck post processing.

FIG. 6 depicts experimental results from an experiment having the chuck temperature increased to +30 degrees Celsius, thus causing charge migration to be the dominant residual charging effect, and in this experiment, post-processing was accomplished for the electrostatic chuck. Again, the chucking voltage was reduced in 100 volt increments to achieve a dechucking voltage upon helium burp 304 that occurred at –200 volts. With post-processing, the field emission charging that had occurred with the previously-processed wafer does not cause a decreased electrostatic attraction between the present wafer and the electrostatic chuck surface. Thus, a negative dechucking voltage is necessary to cancel the residual electric field generated by the residual charge.

As can be seen from this experimental data, the temperature at which the electrostatic chuck is operated within the reaction chamber dramatically changes the dechucking voltage that is necessary to cancel the residual electrostatic fields that remain after the chucking voltage has been removed from the electrostatic chuck. Consequently, the prior art use of fixed voltage levels to dechuck the wafer from the electrostatic chuck are not adequate for use in varying chamber environments that produce unpredictable residual electrostatic forces. The inventive dechucking method disclosed herein provides a real time, adaptive method for determining a dechucking voltage under which the wafer can be removed from the electrostatic chuck using a relatively small physical lifting force that will not damage the wafer.

Although various embodiments which incorporate the teachings of the present invention have been shown and described in detail herein, those skilled in the art can readily devise many other varied embodiments that still incorporate these teachings.

What is claimed is:

1. A method of processing a wafer within a plasma reaction chamber comprising the steps of:

first positioning the wafer upon an electrostatic chuck;

next striking a plasma within the plasma reaction chamber;

after the plasma is ignited, applying a chucking voltage to the electrostatic chuck to retain the wafer upon the electrostatic chuck; and next processing the wafer using the plasma.

2. The method of claim 1 wherein the striking step further comprises the steps of:

supplying a strike gas to the plasma reaction chamber; and connecting RF power to an antenna circumscribing said plasma reaction chamber.

3. The method of claim 1 wherein the chucking voltage is a DC voltage applied to an electrode within the electrostatic chuck with reference to the plasma reaction chamber.

4. A method of processing a wafer within a plasma reaction chamber comprising the steps of:

first positioning the wafer upon an electrostatic chuck next supplying a strike gas to the plasma reaction chamber;

next striking a plasma within the plasma reaction chamber;

next connecting RF power to an antenna circumscribing said plasma reaction chamber;

next applying a chucking voltage to the electrostatic chuck to retain the wafer upon the electrostatic chuck; and next processing the wafer using the plasma.

5. The method of claim 4 wherein the chucking voltage is a DC voltage applied to an electrode within the electrostatic chuck with reference to the plasma reaction chamber.

* * * * *